(12) United States Patent  (10) Patent No.: US 9,349,439 B2
Yamamoto  (45) Date of Patent: May 24, 2016

(54) SEMICONDUCTOR DEVICE (71) Applicant: Renesas Electronics Corporation, Kanagawa (JP)

(72) Inventor: Yoshiki Yamamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/715,636

(22) Filed: May 19, 2015

(65) Prior Publication Data

US 2015/0340082 A1   Nov. 26, 2015

(30) Foreign Application Priority Data

May 22, 2014   (JP) .................................. 2014-105855

(51) Int. Cl.
  G11C 5/02      (2006.01)
  G11C 11/419   (2006.01)
  G11C 7/18      (2006.01)
  G11C 5/04      (2006.01)
  G11C 5/06      (2006.01)
  G11C 11/4097  (2006.01)

(52) U.S. Cl.
  CPC .............. G11C 11/419 (2013.01); G11C 5/025 (2013.01); G11C 5/04 (2013.01); G11C 5/063 (2013.01); G11C 7/18 (2013.01); *G11C 11/4097* (2013.01)

(58) Field of Classification Search
  CPC .......... G11C 5/025; G11C 5/04; G11C 5/063; G11C 7/18; G11C 11/4097
  USPC ...................... 365/51, 233.16, 233.17, 233.19
  See application file for complete search history.

(56) References Cited

U.S. PATENT DOCUMENTS

| 6,483,739 | B2* | 11/2002 | Houston | G11C 11/412 |
| | | | | 365/154 |
| 6,975,551 | B2* | 12/2005 | Iwata | G11C 11/406 |
| | | | | 257/E29.302 |
| 7,532,501 | B2* | 5/2009 | Joshi | H01L 27/1104 |
| | | | | 365/154 |
| 8,760,917 | B2* | 6/2014 | Lusetsky | H01L 29/7881 |
| | | | | 365/149 |
| 9,218,857 | B2* | 12/2015 | Hsu | G11C 11/413 |
| 2009/0134468 | A1 | 5/2009 | Tsuchiya et al. | |

FOREIGN PATENT DOCUMENTS

JP      2009-135140 A      6/2009

* cited by examiner

Primary Examiner — Pho M Luu
(74) Attorney, Agent, or Firm — Mattingly & Malur, P.C.

(57) ABSTRACT

An intermediate mode is set between the active mode in which a threshold voltage is low and a standby mode in which a threshold voltage is high. When a mode is shifted from the active mode to the standby mode, the threshold voltage for the active mode is raised temporarily to a threshold voltage for the intermediate mode and then the threshold voltage for the intermediate mode is raised to the threshold voltage for the standby mode. When a mode is shifted from the standby mode to the active mode, the threshold voltage for the standby mode is lowered temporarily to the threshold voltage for the intermediate mode and then the threshold voltage for the intermediate mode is lowered to the threshold voltage for the active mode.

11 Claims, 8 Drawing Sheets

SEMICONDUCTOR DEVICE

CROSS-REFERENCE TO RELATED APPLICATION

The present application claims priority from Japanese Patent Application No. 2014-105855 filed on May 22, 2014, the content of which is hereby incorporated by reference into this application.

TECHNICAL FIELD OF THE INVENTION

The present invention relates to a semiconductor device, and to a technique that can be used preferably to a semiconductor device having a built-in SRAM (Static Random Access Memory) manufactured by, for example, an SOI (Silicon On Insulator) process.

BACKGROUND OF THE INVENTION

Japanese Laid-Open Patent Publication No. 2009-135140 (patent document 1) describes a semiconductor device having, for example, a thin-film BOX (Buried Oxide)-SOI structure and capable of achieving the high-speed operation of a logic circuit as well as the stable operation of a memory circuit. According to this semiconductor device, at least three or more well regions different in conductive property are formed in a semiconductor substrate. Through the well regions, a semiconductor substrate region below the first gate electrode of a first field-effect transistor making up the logic circuit is electrically isolated from a semiconductor substrate region below the second gate electrode of a second field-effect transistor making up the memory circuit.

SUMMARY OF THE INVENTION

According a semiconductor device having a built-in SRAM of a thin-film BOX-SOI structure, the threshold voltage of a field-effect transistor is set low in an active mode and is set high in a standby mode. However, when the active mode and the standby mode are switched to each other, data retention may transiently become impossible.

Other problems and novel features will be clearly understood from the description of this specification and the accompanying drawings.

According to one embodiment, an intermediate mode is set between an active mode in which the threshold voltage of a field-effect transistor is low and a standby mode in which the threshold voltage of the field-effect transistor is high. When a mode is shifted from the active mode to the standby mode, the threshold voltage for the active mode is raised temporarily to a threshold voltage for the intermediate mode and then the threshold voltage for the intermediate mode is raised to the threshold voltage for the standby mode. When a mode is shifted from the standby mode to the active mode, the threshold voltage for the standby mode is lowered temporarily to the threshold voltage for the intermediate mode and then the threshold voltage for the intermediate mode is lowered to the threshold voltage for the active mode.

According to one embodiment, a semiconductor device having a built-in SRAM of a thin-film BOX-SOI structure is capable of performing switching between an active mode and standby mode while retaining data.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle.

Further, in the embodiments described below, it goes without saying that the components (including element steps) are not always indispensable unless otherwise stated or except the case where the components are apparently indispensable in principle.

It is also obvious that expressions "composed of A", "made up of A", "having A", and "including A" do not exclude elements other than an element A, except a case where these expressions are defined as expressions that refer exclusively to the sole element A. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In the following embodiments, a MISFET (Metal Insulator Semiconductor Field-Effect Transistor), which is a typical field-effect transistor, is referred to as MIS transistor. Accordingly, a p-channel type MISFET is referred to as pMIS transistor and an n-channel type MISFET is referred to as nMIS transistor. A MOSFET (Metal Oxide Semiconductor Field-Effect Transistor) is a field-effect transistor whose gate insulating film is made of a silicon oxide ($SiO_2$), etc., and is regarded as one included in a narrower concept of the MISFET in terms of field-effect transistor categorization.

Further, in some drawings used in the embodiments, hatching is omitted in some cases even in a cross-sectional view so as to make the drawings easy to see. Note that members having the same function are denoted by the same reference symbols throughout all drawings for describing the embodiments, and the repetitive description thereof will be omitted. Hereinafter, the present embodiments will be described based on the drawings.

As described in the above patent document 1, according to a SRAM composed of a CMOS (Complementary Metal Oxide Semiconductor) device, the threshold voltage of a pMIS transistor and the threshold voltage of an nMIS transistor are controlled by controlling substrate biases. In an active mode, a low threshold voltage is set to realize a proper operation speed. In a standby mode, on the other hand, a high threshold voltage is set to realize data retention. However, when the active mode and the standby mode are switched to each other, data retention may transiently become impossible.

Figure 1:
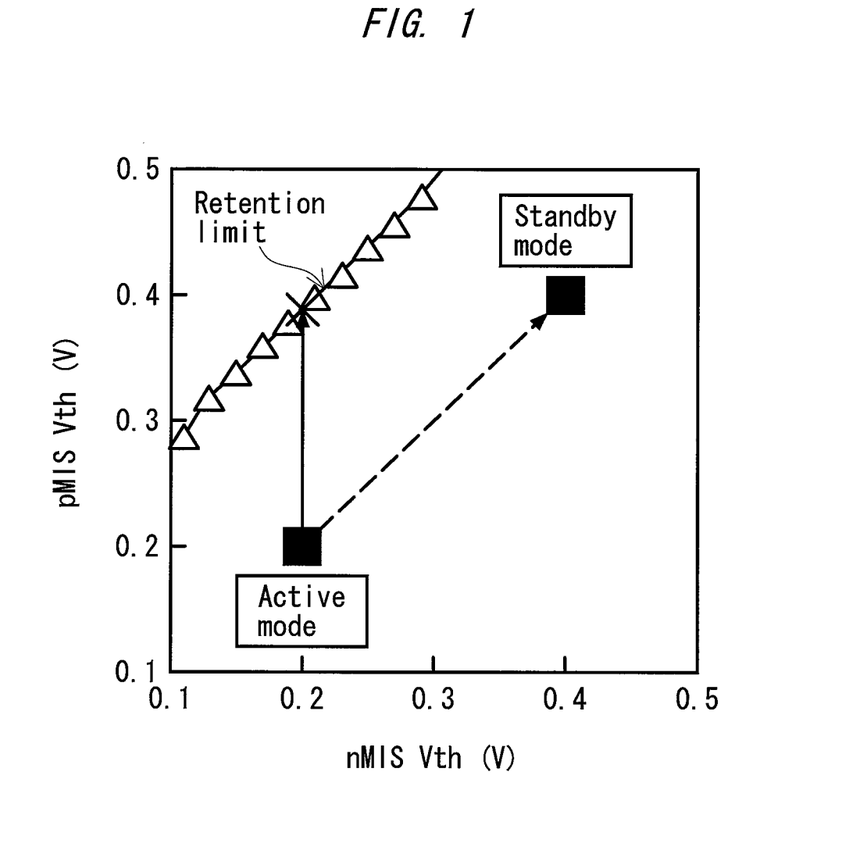
FIG. 1 is a graph of an example of results of simulation of the balance of the threshold voltage of a pMIS transistor (pMIS Vth) and the threshold voltage of an nMIS transistor (nMIS Vth) in a SRAM.

FIG. 1 shows an example of results of simulation of the balance of the threshold voltage of the pMIS transistor (pMIS Vth) and the threshold voltage of the nMIS transistor (nMIS Vth) in the SRAM.

As shown in FIG. 1, when a mode is shifted from the active mode in which the threshold voltage is low to the standby mode in which the threshold voltage is high, the threshold voltage of the pMIS transistor rises transiently to exceed a data retention limit, which results in a situation where data cannot be retained anymore.

First Embodiment

Figure 2:
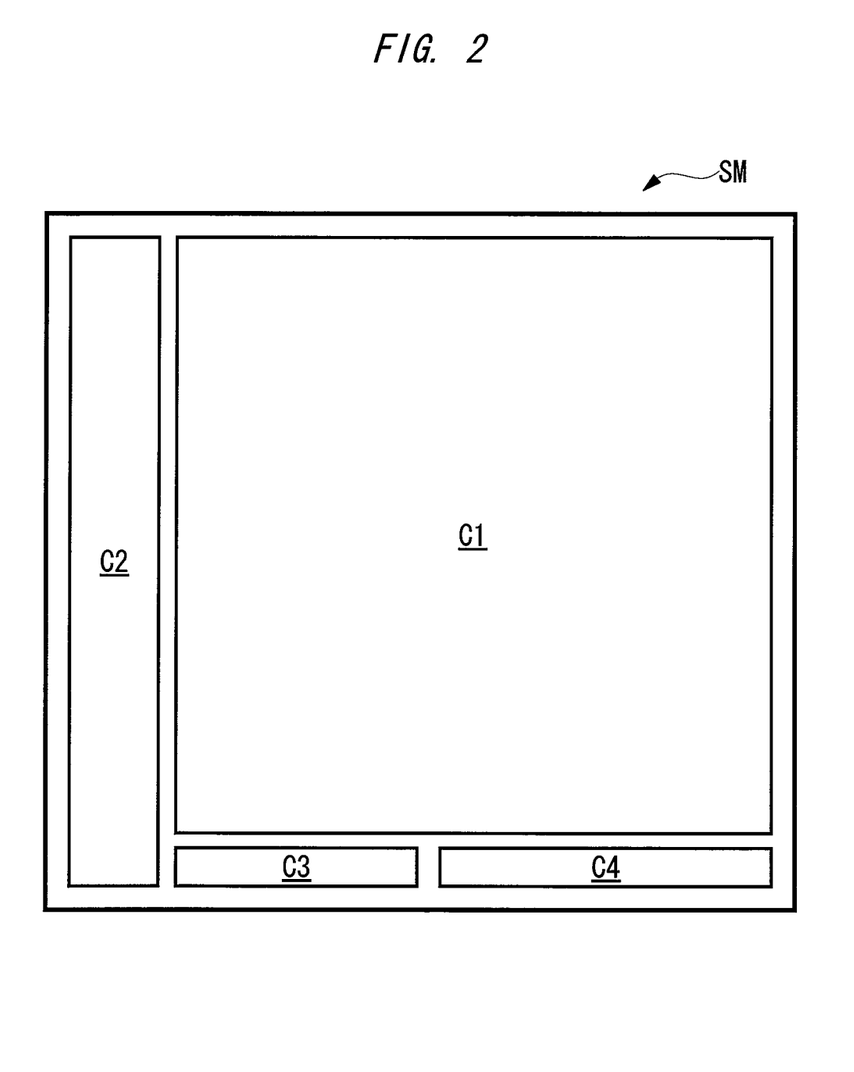
FIG. 2 is an internal configuration diagram of a semiconductor device according to a first embodiment.

FIG. 2 is an internal configuration diagram of a semiconductor device according to a first embodiment.

A semiconductor device SM includes a plurality of circuits, such as a memory circuit C1, a control circuit C2, a substrate bias generating circuit C3, and a substrate bias timing control circuit C4. The memory circuit C1 stores therein data and programs, and the control circuit C2 calculates or controls data. Data and programs are thus exchanged between the memory circuit C1 and the control circuit C2.

When an external signal for shifting a mode from the active mode to the standby mode or from the standby mode to the active mode is input to the semiconductor device SM, the substrate bias generating circuit C3 generates a plurality of substrate biases different from each other. A substrate bias selected out of these a plurality of substrate biases by the substrate bias timing control circuit C4 is applied to memory cells of a plurality of SRAMs formed in the memory circuit C1.

Figure 3:
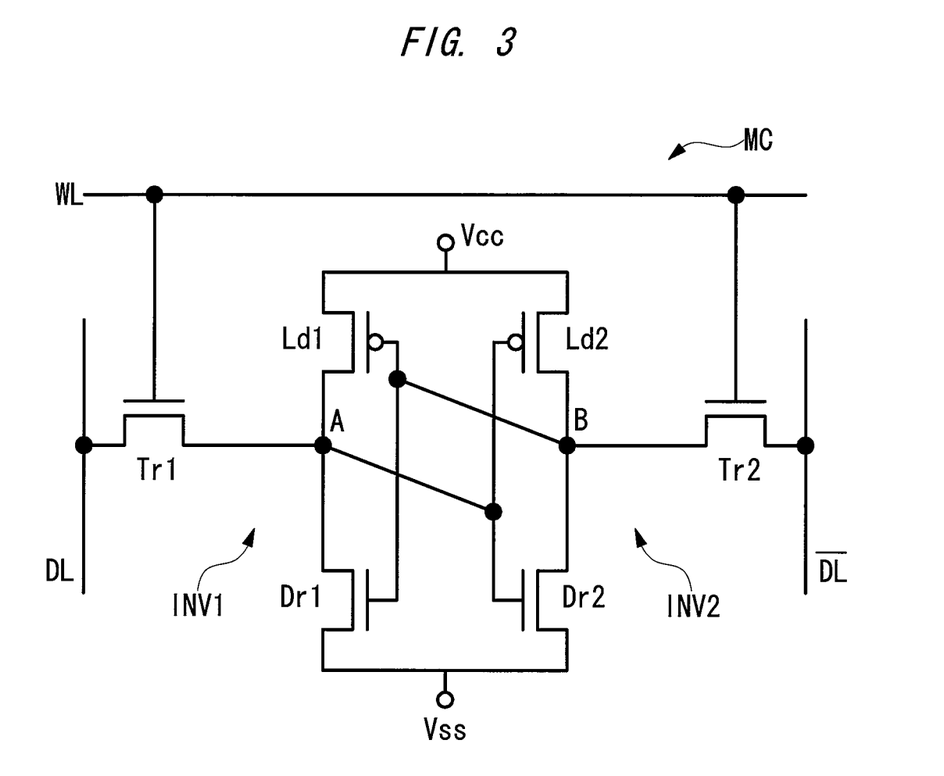
FIG. 3 is an equivalent circuit diagram of a memory cell of a SRAM according to the first embodiment.

FIG. 3 shows an equivalent circuit diagram of a memory cell of a SRAM according to the first embodiment.

As shown in FIG. 3, a SRAM cell MC is disposed at the intersections of a pair of complementary data lines (data line DL and data line/DL) and a word line WL, and is composed of a pair of driving MIS transistors Dr1 and Dr2, a pair of load MIS transistors Ld1 and Ld2, and a pair of transfer MIS transistors Tr1 and Tr2. The driving MIS transistors Dr1 and Dr2 and transfer MIS transistors Tr1 and Tr2 are included in nMIS transistors, and the load MIS transistors Ld1 and Ld2 are included in pMIS transistors.

Among the six MIS transistors including the SRAM cell MC, the driving MIS transistor Dr1 and the load MIS transistor Ld1 make up a CMOS inverter INV1, while the driving MIS transistor Dr2 and the load MIS transistor Ld2 make up a CMOS inverter INV2. Respective input/output terminals (memory nodes A and B) of these pairs of CMOS inverters INV1 and INV2 are cross-linked to each other and make up a flip-flop circuit serving as an information saving unit that saves one-bit information.

One input/output terminal (memory node A) of the flip-flop circuit is connected to one of the source and drain of the transfer MIS transistor Tr1, and the other input/output terminal (memory node B) of the same is connected to one of the source and drain of the transfer MIS transistor Tr2. The other of the source and drain of the transfer MIS transistor Tr1 is connected to the data line DL, and the other of the source and drain of the transfer MIS transistor Tr2 is connected to the data line/DL. One end of the flip-flop circuit (respective sources of the load MIS transistors Ld1 and Ld2) is connected to a source voltage Vcc, and the other end of the same (respective sources of the driving MIS transistors Dr1 and Dr2) is connected to a reference voltage Vss (e.g., 0 V).

Figure 4:
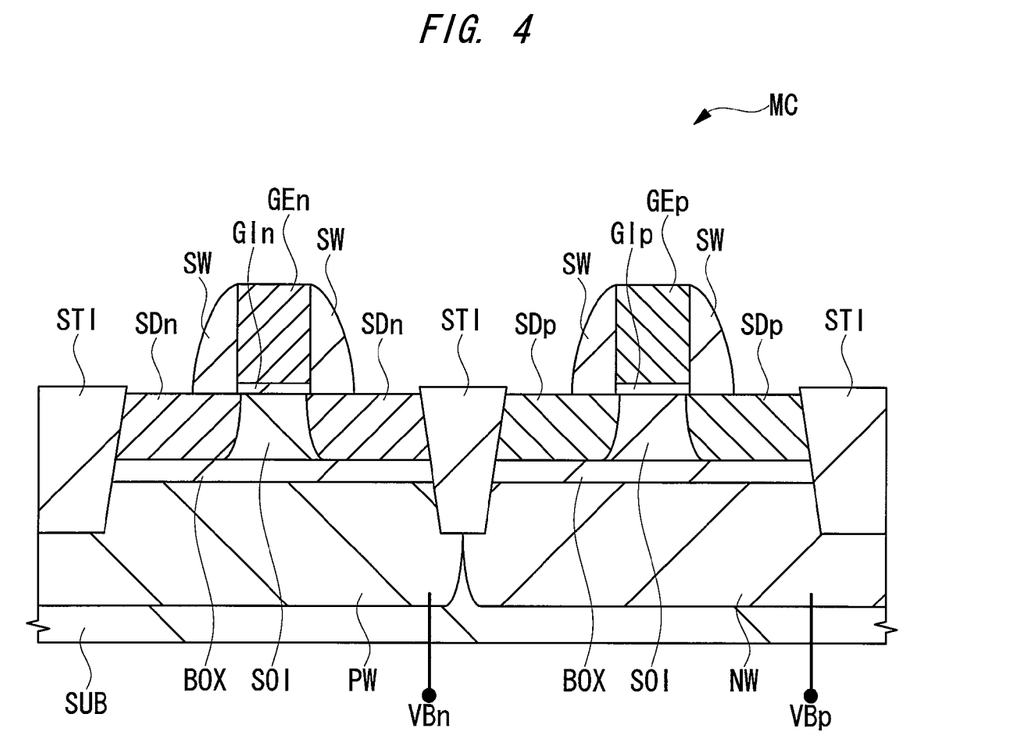
FIG. 4 is a cross-sectional view of main parts of the pMIS transistor and nMIS transistor including a memory cell of the SRAM according to the first embodiment.

FIG. 4 is a cross-sectional view of main parts of the pMIS transistor and nMIS transistor including a memory cell of the SRAM according to the first embodiment.

The SRAM cell MC has a semiconductor substrate SUB, an insulating film BOX formed on the semiconductor substrate SUB, and a semiconductor layer SOI formed on the insulating film BOX. The insulating film BOX is, for example, about 10 nm in thickness.

A pMIS transistor shown on the right in FIG. 4 has source/drain regions SDp formed in the semiconductor layer SOI, and a gate structure formed on the semiconductor layer SOI. The gate structure is composed of a gate insulating film GIp formed on the semiconductor layer SOI and a gate electrode GEp formed on the gate insulating film GIp. On both sides of the gate structure, a side wall SW made of an insulating film is formed. The source/drain regions SDp are formed in the semiconductor layer SOI on both sides of the gate electrode GEp.

An nMIS transistor shown on the left in FIG. 4 has source/drain regions SDn formed in the semiconductor layer SOI, and a gate structure formed on the semiconductor layer SOI. The gate structure is composed of a gate insulating film GIn formed on the semiconductor layer SOI and a gate electrode GEn formed on the gate insulating film GIn. On both sides of the gate structure, a side wall SW made of an insulating film is formed. The source/drain regions SDn are formed in the semiconductor layer SOI on both sides of the gate electrode GEn. The pMIS transistor and the nMIS transistor are electrically isolated from each other via an element isolation film STI.

The impurity concentration of the semiconductor layer SOI in regions under the gate electrode GEp of the pMIS transistor and under the gate electrode GEn of the nMIS transistor (i.e., channel regions) is approximately $1 \times 10^{16}/\text{cm}^3$.

In the semiconductor substrate SUB below the gate electrode GEp of the pMIS transistor, an n-type well region NW is formed, and a substrate bias VBp is applied to the n-type well region NW. In the semiconductor substrate SUB below the gate electrode GEn of the nMIS transistor, an p-type well region PW is formed, and a substrate bias VBn is applied to the p-type well region PW. In a SRAM cell MC for which the substrate biases VBn and VBp are not used, the substrate bias VBp is fixed to the potential equal to the source voltage, while the substrate bias VBn is fixed to the potential equal to the reference potential.

The SRAM of the first embodiment is characterized in that an intermediate mode is set between the active mode and the standby mode and the threshold voltage is temporarily stabilized in this intermediate mode when the active mode and the standby mode are switched to each other.

As shown in FIG. 1, a result of simulation of the balance of the threshold voltage of the pMIS transistor and the threshold voltage of the nMIS transistor has clearly demonstrated that, in particularly, when a mode is shifted from the active mode in which the threshold voltage is low to the standby mode in which the threshold voltage is high, the threshold voltage of the pMIS transistor rises transiently to exceed the data retention limit, thereby making data retention impossible.

Therefore, the threshold voltages of the pMIS transistor and nMIS transistor are raised step by step to prevent a transient rise in the threshold voltage of the pMIS transistor. In addition, timing of shifting the threshold voltage of the nMIS transistor is made to be slightly earlier than timing of shifting the threshold voltage of the pMIS transistor to ensure that the threshold voltage of the pMIS transistor does not rise transiently.

A method of switching between the active mode and the standby mode according to the first embodiment will hereinafter be described.

Figure 5:
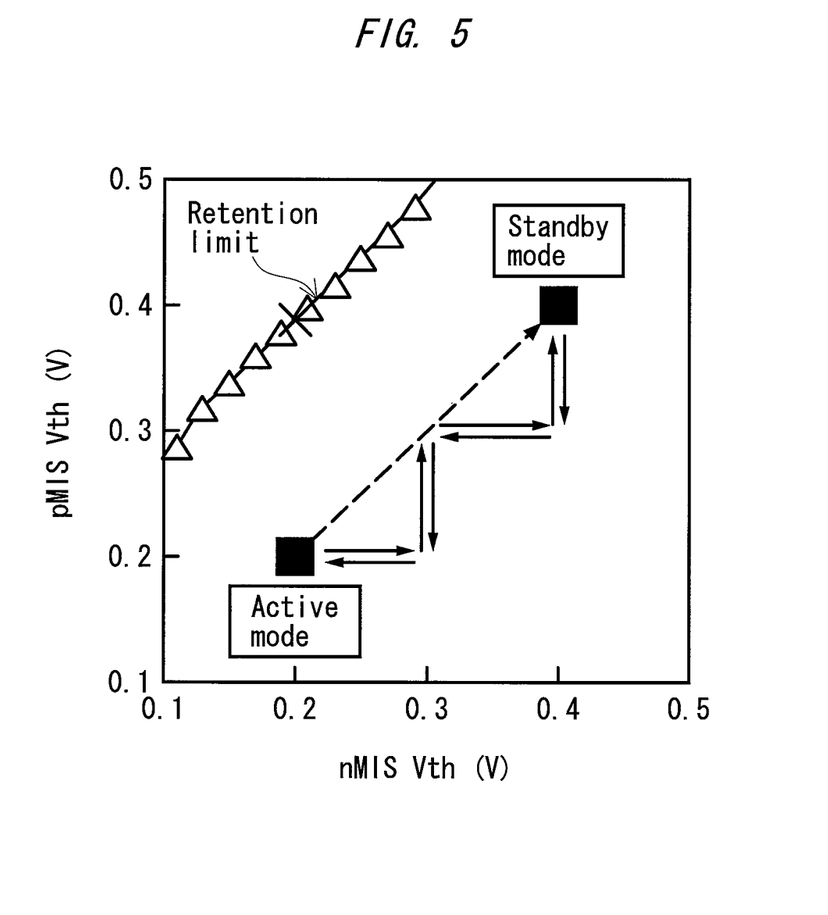
FIG. 5 is a graph of an example of images of the balance of the threshold voltage of the pMIS transistor (pMIS Vth) and the threshold voltage of the nMIS transistor (nMIS Vth) according to the first embodiment.

FIG. 5 is a graph of an example of images of the balance of the threshold voltage of the pMIS transistor (pMIS Vth) and the threshold voltage of the nMIS transistor (nMIS Vth) according to the first embodiment.

As shown in FIG. 5, when respective threshold voltages (pMIS Vth and nMIS Vth) for the active mode and the standby mode according to the first embodiment are, for example,
active mode: pMIS Vth=nMIS Vth=0.2 V, and
standby mode: pMIS Vth=nMIS Vth=0.4 V, the threshold voltage (pMIS Vth and nMIS Vth) for the intermediate mode is set as intermediate mode: pMIS Vth=nMIS Vth=0.3 V.

Specifically, when a mode is shifted from the active mode to the standby mode, the threshold voltage of the nMIS transistor (nMIS Vth) is raised first from 0.2 V to 0.3 V and then the threshold voltage of the pMIS transistor (pMIS Vth) is raised from 0.2 V to 0.3 V. Subsequently, the threshold voltage of the nMIS transistor (nMIS Vth) is raised from 0.3 V to 0.4 V and then the threshold voltage of the pMIS transistor (pMIS Vth) is raised first from 0.3 V to 0.4 V. This process prevents the threshold voltage of the pMIS transistor from rising transiently and exceeding the data retention limit.

The timing of shifting respective threshold voltages of the nMIS and pMIS transistors, however, is not limited to this. The timing of shifting the threshold voltage of the nMIS transistor may be matched to the timing of shifting the threshold voltage of the pMIS transistor, or the timing of shifting the threshold voltage of the pMIS transistor may be made to be slightly earlier than the timing of shifting the threshold voltage of the nMIS transistor. However, so as to ensure that the threshold voltage of the pMIS transistor does not rise transiently, it is preferable to make the timing of shifting the threshold voltage of the nMIS transistor slightly earlier than the timing of shifting the threshold voltage of the pMIS transistor.

When a mode is shifted from the standby mode to the active mode, in contrast, the threshold voltage of the pMIS transistor (pMIS Vth) is lowered first from 0.4 V to 0.3 V and then the threshold voltage of the nMIS transistor (nMIS Vth) is lowered from 0.4 V to 0.3 V. Subsequently, the threshold voltage of the pMIS transistor (pMIS Vth) is lowered from 0.3 V to 0.2 V and then the threshold voltage of the nMIS transistor (nMIS Vth) is lowered from 0.3 V to 0.2 V. This process prevents the threshold voltage of the nMIS transistor from lowering transiently and exceeding a data retention limit.

The timing of shifting respective threshold voltages of the nMIS and pMIS transistors, however, is not limited to this. The timing of shifting the threshold voltage of the nMIS transistor may be matched to the timing of shifting the threshold voltage of the pMIS transistor, or the timing of shifting the threshold voltage of the nMIS transistor may be made to be slightly earlier than the timing of shifting the threshold voltage of the pMIS transistor.

Respective threshold voltages for the active mode, intermediate mode, and standby mode are controlled by substrate biases.

Figure 6:
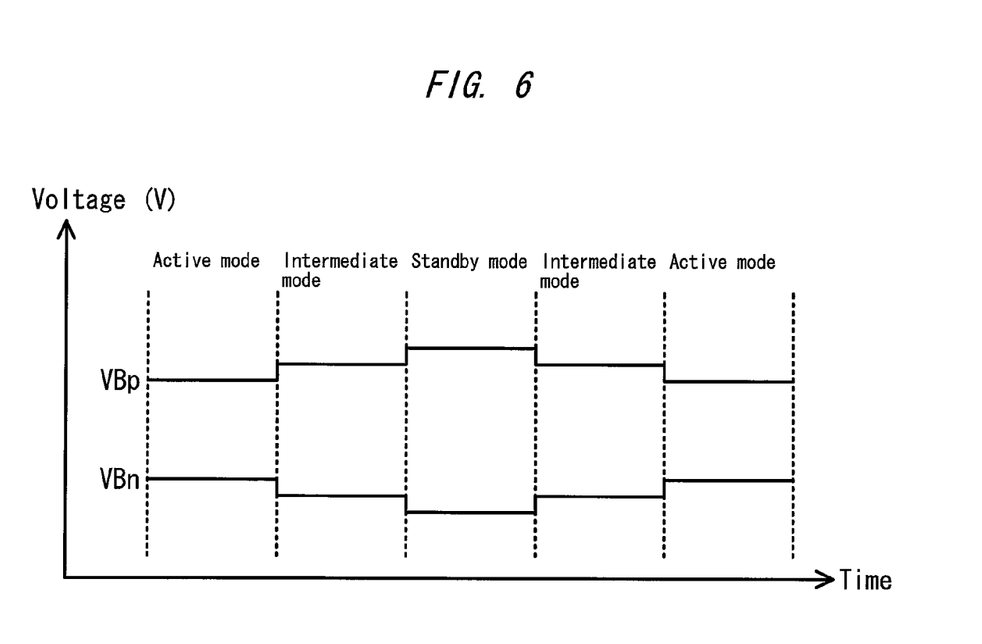
FIG. 6 is a graph showing an example of a timing chart of a substrate bias (VBp) of the pMIS transistor and a substrate bias (VBn) of the nMIS transistor according to the first embodiment.

FIG. 6 is a graph showing an example of a timing chart of a substrate bias (VBp) of the pMIS transistor and a substrate bias (VBp) of the nMIS transistor according to the first embodiment.

As shown in FIG. 6, substrate biases for setting respective threshold voltages for the active mode, intermediate mode, and standby mode are set in respective modes. The substrate bias (VBp) of the pMIS transistor and the substrate bias (VBn) of the nMIS transistor in each mode according to the first embodiment are set as, for example,
active mode: VBp=Vcc, VBn=0 V,
intermediate mode: VBp=Vcc+1 V, VBn=−1 V, and
standby mode: VBp=Vcc+2 V, VBn=−2 V
where Vcc denotes the source voltage.

When a mode is shifted from the active mode to the standby mode, the substrate bias (VBn) of 0 V to the nMIS transistor is set to −1 V, and the substrate bias (VBp) of Vcc to the pMIS transistor is set to Vcc+1 V. As a result, the threshold voltage of the nMIS transistor and the threshold voltage of the pMIS transistor are each raised, for example, from 0.2 V to 0.3 V. Subsequently, the substrate bias (VBn) of the nMIS transistor is set from −1 V to −2 V, and the substrate bias (VBp) of the pMIS transistor is set from Vcc+1 V to Vcc+2 V. As a result, the threshold voltage of the nMIS transistor and the threshold voltage of the pMIS transistor are each raised, for example, from 0.3 V to 0.4 V.

When a mode is shifted from the standby mode to the active mode, in contrast, the substrate bias (VBp) of the pMIS transistor is set from Vcc+2 V to Vcc+1 V, and the substrate bias (VBn) of the nMIS transistor is set from −2V to −1 V. As a result, the threshold voltage of the nMIS transistor and the threshold voltage of the pMIS transistor are each lowered first, for example, from 0.4 V to 0.3 V. Subsequently, the substrate bias (VBp) of the pMIS transistor is set from Vcc+1 V to Vcc and the substrate bias (VBn) of the nMIS transistor is set from −1 V to 0 V. As a result, the threshold voltage of the nMIS transistor and the threshold voltage of the pMIS transistor are each lowered, for example, from 0.3 V to 0.2 V.

Figure 7:
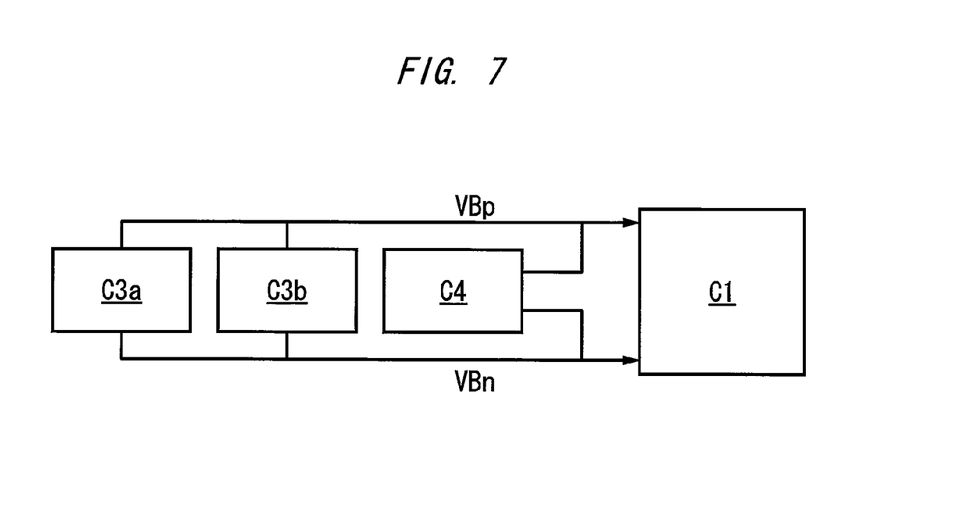
FIG. 7 is a schematic view of an example of a circuit configuration that generates substrate biases according to the first embodiment.

FIG. 7 is a schematic view of an example of a circuit configuration that generates substrate biases according to the first embodiment.

The substrate bias generating circuit C3 of FIG. 2 includes a plurality of substrate bias generating circuits. The circuit configuration that generates substrate biases by using two substrate bias generating circuits (first substrate bias generating circuit C3a and second substrate bias generating circuit C3b) will be described, referring to FIG. 7.

The first substrate bias generating circuit C3a generates substrate biases VBn and VBp for setting respective threshold voltages of the pMIS and nMIS transistors in the intermediate mode. The second substrate bias generating circuit C3b generates substrate biases VBn and VBp for setting respective threshold voltages of the pMIS and nMIS transistors in the standby mode.

The substrate bias timing control circuit C4 selects the substrate biases VBn and VBp generated by the first substrate bias generating circuit C3a or the substrate biases VBn and VBp generated by the second substrate bias generating circuit C3b. Hence the selected substrate biases VBn and VBp are applied to the SRAM cell formed in the memory circuit C1.

In this manner, according to the first embodiment, the intermediate mode is set between the active mode and the standby mode when the active mode and the standby mode are switched to each other. This can prevent the situation where the threshold voltage of the pMIS transistor rises transiently to exceed the data retention limit. Hence, the active mode and the standby mode can be switched to each other, while data is retained securely.

As shown in FIG. 1, a simulation result has clearly demonstrated that, in particular, when a mode is shifted from the active mode in which the threshold voltage is low to the standby mode in which the threshold voltage is high, the threshold voltage of the pMIS transistor rises transiently to exceed the data retention limit, thereby making data retention impossible. Thus, in the first embodiment, the method of preventing a transient rise in the threshold voltage of the pMIS transistor has been mainly described. However, depending on the structure of the SRAM cell, such a case may also happen that the threshold voltage of the nMIS transistor rises transiently to exceed the data retention limit, thereby making data retention impossible. In this case, in the same manner as in the first embodiment, the intermediate mode is set between the active mode and the standby mode and when the active mode and the standby mode are switched to each other, and the threshold voltage is temporarily stabilized in the intermediate mode. This can prevent a transient rise in the threshold voltage of the nMIS transistor.

Second Embodiment

As shown in FIG. 1, a simulation result has clearly demonstrated that, in particular, when a mode is shifted from the active mode in which the threshold voltage is low to the standby mode in which the threshold voltage is high, the threshold voltage of only the pMIS transistor rises transiently to exceed the data retention limit, thereby making data retention impossible. This possibly leads to a conclusion that when a mode is shifted from the active mode to the standby mode, data destruction is prevented by raising the threshold voltage of the nMIS transistor first, and that when a mode is shifted from the standby mode to the active mode, data destruction is prevented by lowering the threshold voltage of the pMIS transistor first.

A method of switching between the active mode and the standby mode according to a second embodiment will hereinafter be described.

Figure 8:
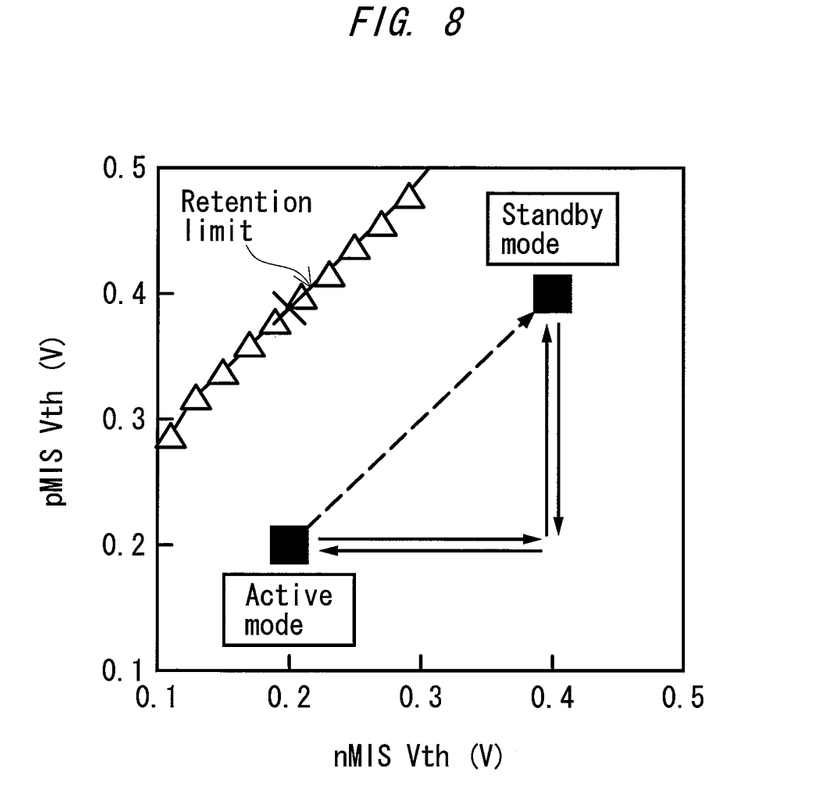
FIG. 8 is a graph of an example of images of the balance of the threshold voltage of the pMIS transistor (pMIS Vth) and the threshold voltage the nMIS transistor (nMIS Vth) according to a second embodiment.

FIG. 8 is a graph of an example of images of the balance of the threshold voltage of the pMIS transistor (pMIS Vth) and the threshold voltage of the nMIS transistor (nMIS Vth) according to the second embodiment.

As shown in FIG. 8, respective threshold voltages (pMIS Vth and nMIS Vth) for the active mode and the standby mode according to the second embodiment are set as, for example,
active mode: pMIS Vth=nMIS Vth=0.2 V, and
standby mode: pMIS Vth=nMIS Vth=0.4 V.
In this case, the threshold voltage for the intermediate mode according to the first embodiment is not set.

Specifically, when a mode is shifted from the active mode to the standby mode, the threshold voltage of the nMIS transistor (nMIS Vth) is raised first from 0.2 V to 0.4 V and then the threshold voltage of the pMIS transistor (pMIS Vth) is raised from 0.2 V to 0.4 V. This process prevents the threshold voltage of the pMIS transistor from rising transiently and exceeding the data retention limit.

When a mode is shifted from the standby mode to the active mode, in contrast, the threshold voltage of the pMIS transistor (pMIS Vth) is lowered first from 0.4 V to 0.2 V and then the threshold voltage of the nMIS transistor (nMIS Vth) is lowered from 0.4 V to 0.2 V. This process prevents the threshold voltage of the nMIS transistor from lowering transiently and exceeding a data retention limit.

Respective threshold voltages for the active mode and the standby mode are controlled by substrate biases.

Figure 9:
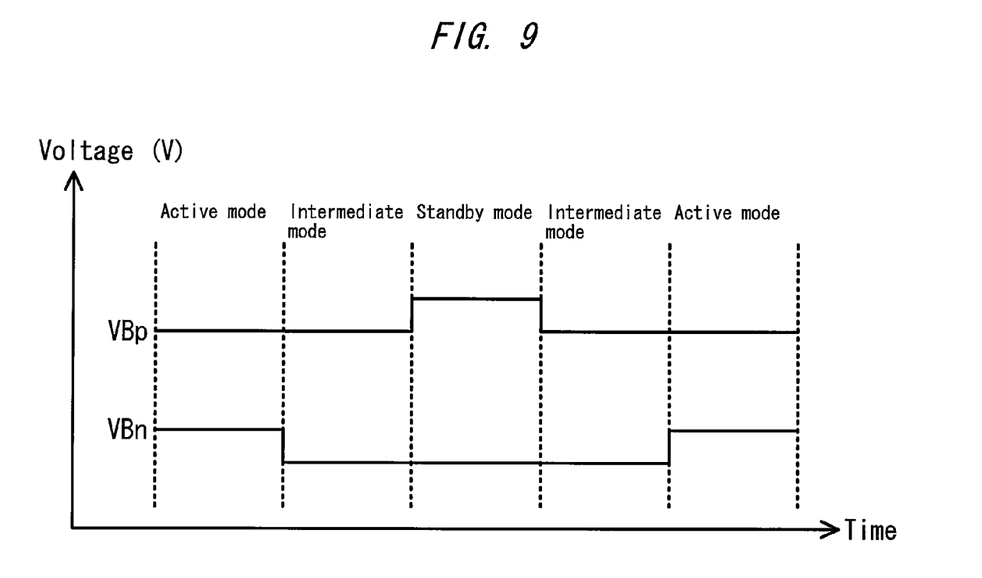
FIG. 9 is a graph showing an example of a timing chart of a substrate bias (VBp) of the pMIS transistor and a substrate bias (VBn) of the nMIS transistor according to the second embodiment.

FIG. 9 is a graph showing an example of a timing chart of a substrate bias (VBp) of the pMIS transistor and a substrate bias (VBp) of the nMIS transistor, according to the second embodiment.

As shown in FIG. 9, substrate biases for setting respective threshold voltages for the active mode and the standby mode are set in respective modes. The substrate bias (VBp) of the pMIS transistor and the substrate bias (VBn) of the nMIS transistor in each mode according to the second embodiment are set as, for example,
active mode: VBp=Vcc, VBn=0 V, and
standby mode: VBp=Vcc+2 V, VBn=−2 V
where Vcc denotes the source voltage.

When a mode is shifted from the active mode to the standby mode, the substrate bias (VBn) of the nMIS transistor is set from 0 V to −2 V while the substrate bias (VBp) of the pMIS transistor is maintained at Vcc. As a result, the threshold voltage of the nMIS transistor is raised, for example, from 0.2 V to 0.4 V. Subsequently, the substrate bias (VBp) of the pMIS transistor is set from Vcc to Vcc+2 V while the substrate bias (VBn) of the nMIS transistor is maintained at −2 V. As a result, the threshold voltage of the pMIS transistor is raised, for example, from 0.2 V to 0.4 V.

When a mode is shifted from the standby mode to the active mode, in contrast, the substrate bias (VBp) of the pMIS transistor is set from Vcc+2 V to Vcc while the substrate bias (VBn) of the nMIS transistor is maintained at −2 V. As a result, the threshold voltage of the pMIS transistor is lowered, for example, from 0.4 V to 0.2 V. Subsequently, the substrate bias (VBn) of the nMIS transistor is set from −2 V to 0 V while the substrate bias (VBp) of the pMIS transistor is maintained at Vcc. As a result, the threshold voltage of the nMIS transistor is lowered, for example, from 0.4 V to 0.2 V.

In this manner, according to the second embodiment, when a mode is shifted from the active mode to the standby mode, the threshold voltage of the nMIS transistor is raised first and then the threshold voltage of the pMIS transistor is raised. When a mode is shifted from the standby mode to the active mode, the threshold voltage of the pMIS transistor is lowered first and then the threshold voltage of the nMIS transistor is lowered. Through this process, the active mode and the standby mode can be switched to each other while data is retained securely.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the above embodiments relate to the cases where the present invention is applied to the SRAM cell having the thin-film BOX-SOI structure, the present invention may also be applied to a SRAM cell not having the thin-film BOX-SOI structure.

What is claimed is:

1. A semiconductor device comprising a memory circuit including a memory cell having a first field-effect transistor of a first conductive type and a second field-effect transistor of a second conductive type different from the first conductive type,
wherein the memory cell has:
an active mode in which the first field-effect transistor is activated by a first threshold voltage and the second field-effect transistor is activated by a second threshold voltage; and
a standby mode in which the first field-effect transistor is activated by a third threshold voltage higher than the first threshold voltage and the second field-effect transistor is activated by a fourth threshold voltage higher than the second threshold voltage, and
when a mode is shifted from the active mode to the standby mode, a threshold voltage of the first field-effect transistor is shifted temporarily from the first threshold voltage to a fifth threshold voltage between the first threshold voltage and the third threshold voltage, and a threshold voltage of the second field-effect transistor is shifted temporarily from the second threshold voltage to a sixth threshold voltage between the second threshold voltage and the fourth threshold voltage.

2. The semiconductor device according to claim 1,
wherein timing of raising a threshold voltage of the first field-effect transistor from the first threshold voltage to the fifth threshold voltage is earlier than timing of raising a threshold voltage of the second field-effect transistor from the second threshold voltage to the sixth threshold voltage.

3. The semiconductor device according to claim 2,
wherein the first field-effect transistor is an n-channel type field-effect transistor, and the second field-effect transistor is a p-channel type field-effect transistor.

4. The semiconductor device according to claim 1,
wherein when a mode is shifted from the standby mode to the active mode, a threshold voltage of the first field-effect transistor is shifted temporarily from the third threshold voltage to a seventh threshold voltage between the first threshold voltage and the third threshold voltage, and a threshold voltage of the second field-effect transistor is shifted temporarily from the fourth threshold voltage to an eighth threshold voltage between the second threshold voltage and the fourth threshold voltage.

5. The semiconductor device according to claim 4,
wherein timing of lowering a threshold voltage of the second field-effect transistor from the fourth threshold voltage to the eighth threshold voltage is earlier than timing of lowering a threshold voltage of the first field-effect transistor from the third threshold voltage to the seventh threshold voltage.

6. The semiconductor device according to claim 5,
wherein the first field-effect transistor is an n-channel type field-effect transistor, and the second field-effect transistor is a p-channel type field-effect transistor.

7. The semiconductor device according to claim 1,
wherein the first field-effect transistor and the second field-effect transistor are formed in a first region and a second region, respectively, the first and second regions being different regions of a semiconductor layer formed on a semiconductor substrate via an insulating film,
a first well region of the second conductive type is formed in the semiconductor substrate below the first region where the first field-effect transistor is formed,
a second well region of the first conductive type is formed in the semiconductor substrate below the second region where the second field-effect transistor is formed,
the first threshold voltage and the third threshold voltage of the first field-effect transistor are set by controlling a substrate bias applied to the first well region, and
the second threshold voltage and the fourth threshold voltage of the second field-effect transistor are set by controlling a substrate bias applied to the second well region.

8. A semiconductor device comprising a memory circuit including a memory cell having a first field-effect transistor of a first conductive type and a second field-effect transistor of a second conductive type different from the first conductive type,
wherein the memory cell has:
an active mode in which the first field-effect transistor is activated by a first threshold voltage and the second field-effect transistor is activated by a second threshold voltage; and
a standby mode in which the first field-effect transistor is activated by a third threshold voltage higher than the first threshold voltage and the second field-effect transistor is activated by a fourth threshold voltage higher than the second threshold voltage, and
when a mode is shifted from the active mode to the standby mode, the first threshold voltage of the first field-effect transistor is raised first to the third threshold voltage and then the second threshold voltage of the second field-effect transistor is raised to the fourth threshold voltage.

9. The semiconductor device according to claim 8,
wherein when a mode is shifted from the standby mode to the active mode, the fourth threshold voltage of the second field-effect transistor is lowered first to the second threshold voltage and then the third threshold voltage of the first field-effect transistor is lowered to the first threshold voltage.

10. The semiconductor device according to claim 8,
wherein the first field-effect transistor is an n-channel type field-effect transistor, and the second field-effect transistor is a p-channel type field-effect transistor.

11. The semiconductor device according to claim 8,
wherein the first field-effect transistor and the second field-effect transistor are formed in a first region and a second region, respectively, the first and second regions being different regions of a semiconductor layer formed on a semiconductor substrate via an insulating film,
a first well region of the second conductive type is formed in the semiconductor substrate below the first region where the first field-effect transistor is formed,
a second well region of the first conductive type is formed in the semiconductor substrate below the second region where the second field-effect transistor is formed,
the first threshold voltage and the third threshold voltage of the first field-effect transistor are set by controlling a substrate bias applied to the first well region, and
the second threshold voltage and the fourth threshold voltage of the second field-effect transistor are set by controlling a substrate bias applied to the second well region.

* * * * *